United States Patent [19]
Bodager et al.

[11] Patent Number: 5,534,387
[45] Date of Patent: Jul. 9, 1996

[54] TRANSFER PROCESS FOR FORMING A COLORED IMAGE UTILIZING A NON-PHOTOSENSITIVE/PHOTOSENSITIVE COMBINATION

[75] Inventors: Gregory A. Bodager, Monroeton, Pa.; Phillip L. Beighle, Colts Neck, N.J.

[73] Assignee: E. I. Du Pont de Nemours and Company, Wilmington, Del.

[21] Appl. No.: 315,739

[22] Filed: Sep. 30, 1994

[51] Int. Cl.⁶ ........................................................ G03C 5/00
[52] U.S. Cl. ............................ 430/325; 430/326; 430/252; 430/253; 430/258
[58] Field of Search ............................ 430/325, 326, 430/252, 258, 253

[56] References Cited

U.S. PATENT DOCUMENTS

| | | | |
|---|---|---|---|
| 4,272,620 | 6/1981 | Ichimura | 525/61 |
| 4,737,436 | 4/1988 | Thompson | 430/143 |
| 4,937,168 | 6/1990 | Platzer | 430/257 |
| 5,094,931 | 3/1992 | Platzer | 430/258 |
| 5,443,937 | 8/1995 | Bodager et al. | 430/143 |

FOREIGN PATENT DOCUMENTS

| | | |
|---|---|---|
| 1-116539 | 5/1989 | Japan . |
| 1-116540 | 5/1989 | Japan . |

OTHER PUBLICATIONS

International Publication No. WO 92/02857, published Feb. 20, 1992, International Appln. No. PCT/US91/05387, International Filing Date Jul. 30, 1991, Inventors—Gregory Allen Bodager et al.

Primary Examiner—George F. Lesmes
Assistant Examiner—Laura Weiner

[57] ABSTRACT

A process for forming on any printing stock, single colored and multi-colored images using the expose-in-register and laminate-in-register processes is described. Images having high quality, good resolution, and color flexibility not heretofore economically feasible are obtained using the process of the invention.

26 Claims, 5 Drawing Sheets

TRANSFER PROCESS FOR FORMING A COLORED IMAGE UTILIZING A NON-PHOTOSENSITIVE/PHOTOSENSITIVE COMBINATION

FIELD OF THE INVENTION

This invention relates to the formation of colored images. In particular, this invention relates to the formation of a colored image, using an unpigmented photosensitive element and a colorant-containing composition applied thereon, and subsequent transfer of the image to any desired support.

BACKGROUND OF THE INVENTION

Photosensitive elements which can be used in image-reproduction processes are well-known in the graphics arts industry. Such elements are usually exposed to actinic radiation through an image-bearing transparency, such as a color separation transparency, to produce an image which is either a positive or negative with respect to the transparency used.

Such photosensitive elements are widely used in off-press color proofing to simulate the images produced by printing. In a surprint proof, all of the colored images are superimposed, by, for example, multiple exposure, lamination, or transfer, onto a single support. Unlike an overlay proof, the colored images cannot be separated and viewed individually.

Various processes for producing copies of images involving photopolymerization and thermal transfer techniques are known as disclosed in U.S. Pat. Nos. 3,060,023; 3,060,024; 3,060,025; 3,481,736; 3,574,049 and 3,607,264. In these processes, a photopolymerizable layer coated on a suitable support is imagewise exposed to a photographic transparency. The surface of the exposed layer is then pressed into contact with the image receptive surface of a separate element, and at least one of the elements is heated to a temperature above the transfer temperature of the unexposed portions of the layer. The two elements are then separated, whereby the thermally transferable, unexposed, image areas of the composite, transfer to the image receptive element. If the element is not precolored, the tacky, unexposed image may now be selectively colored with a desired toner. All of these processes necessitate the use of specially treated final receptor sheets and are not applicable for obtaining a color proofing image on a paper stock.

If the element is precolored, flexibility in your choice of colors is limited because preparation of the precolored elements in all the desired colors is not economically feasible. Toning provides greater color flexibility but is associated with environmental concerns because the fine powders are difficult to handle. Also, use of toners results in images having significant relief so that it is difficult to obtain high resolution images when it is necessary to superimpose images to make multicolored images.

Precolored wash-off systems are known in the art. These include precolored diazo based imaging systems such as Van Beusekom, U.S. Pat. No. 3,671,236; Cederburg, U.S. Pat. No. 4,656,114; and Sachi, U.S. Pat. No. 4,666,817 which are developed in a mixture of water and 1-propanol; Krech, U.S. Pat. No. 4,260,673 which is developed in base; and Platzer, U.S. Pat. No. 4,751,166, Mino, U.S. Pat. No. 4,783,390 and Adolphson et al., U.S. Pat. No. 5,075,722 which are developed in water. These systems provide improved resolution. However, the elements are precolored and thus, color flexibility is limited because preparation of the precolored elements in all the desired colors is not economically feasible. An additional drawback for systems developed in aqueous base or organic solvents is that they can pose flammability, toxicity, corrosion and/or waste disposal concerns.

Thompson, U.S. Pat. No. 4,737,436 discloses a water based method for making color proof images on a single substrate using a photoresist coating containing a pigment blend. The process provides for the blending of pigments, followed by the combining of the pigment blend with a water soluble photoresist composition, coating a substrate with the photoresist pigment-containing blend, imagewise exposing and developing to produce an image on the substrate. A second image is then formed on the exposed and developed substrate by forming a second pigment blend, followed by the combining of the second pigment blend with a water soluble photoresist composition, coating the substrate having the first image with the photoresist second pigment-containing blend, imagewise exposing and developing to produce a second image on the substrate. This process has several disadvantages. First, combining the pigment blend with the photoresist coating can result in coating solution stability problems. Coating non-uniformity problems can result, with uniform coating becoming increasingly difficult as the size of the work increases. Second, since the pigment blend is mixed with the photoresist prior to coating, compatiblity of the pigment with the photoresist coating becomes an issue. This process is also limited in that it does not provide for the application of colorant to the approximate image areas only.

A need exists for a process that generates a high resolution, high quality color image on virtually any paper stock. Further, a need exists for a process that provides color flexibility without the environmental concerns associated with the previously mentioned proofing systems. A need also exists for a process that provides for application of the colorant to the approximate image areas only rather than the entire photosensitive layer.

SUMMARY OF THE INVENTION

This invention provides a process for forming a colored image, said process comprising, in order:

(A) applying at least one aqueous permeable colorant-containing composition to a photosensitive element comprising, in order,
  (1) a carrier element having a release surface, said carrier element being resistant to aqueous liquid development,
  (2) a first adhesive layer,
  (3) an unpigmented, first photosensitive layer consisting essentially of an aqueous liquid developable photosensitive composition, wherein the aqueous permeable colorant-containing composition is in contact with the first photosensitive layer, wherein the aqueous permeable colorant-containing composition is applied to (3);

(B) imagewise exposing to actinic radiation the photosensitive element from step (A) having applied thereon the permeable colorant-containing composition to form imagewise exposed and unexposed regions in the unpigmented, first photosensitive layer and the overlying permeable colorant-containing composition;

(C) developing the exposed element from step (B) by washing with an aqueous liquid, thereby removing either the imagewise exposed or imagewise unexposed regions, to produce a first colored pattern;

(D) laminating to the element from step (C) a transfer element having a release surface, wherein the release surface is adjacent to the first colored pattern in the element from step (C);

(E) removing said carrier element having a release surface, revealing the adhesive layer;

(F) laminating the element from step (E) to a permanent support, wherein the adhesive layer is adjacent to the permanent support; and (G) removing said transfer element having a release surface; wherein the adhesion force between the release surface of said carrier element and said adhesive layer has a value of F1, the adhesion force between said adhesive layer and said first colored pattern has a value of F2, the adhesion force between said first colored pattern and said release surface of said transfer support has a value of F3, and the adhesion force between said adhesive layer and said permanent support has a value of F4; and wherein each of F2 and F3 is greater than F1, and each of F2 and F4 is greater than F3.

Optionally, this process can be employed to form a multi-colored image. A multi-colored image can be prepared by an expose-in-register process or by a laminate-in-register process. In the expose-in-register process, the process additionally comprises, in order following step (C):

(C1) laminating to the element from step (C) a photosensitive element comprising in order, (1) an additional support, (2) an underlying additional photosensitive layer comprising, (a) at least one aqueous developable, unpigmented, photosensitive composition; and (3) an underlying additional adhesive layer; wherein the additional adhesive layer is adjacent to and overlying the first colored pattern in the element from step (C);

(C2) removing said additional support;

(C3) applying at least one aqueous permeable colorant-containing composition to the additional photosensitive layer;

(C4) imagewise exposing to actinic radiation said additional photosensitive layer and the aqueous permeable colorant-containing composition in register with the previously formed first colored pattern to form imagewise exposed and imagewise unexposed regions;

(C5) developing said exposed additional photosensitive layer and the aqueous permeable colorant-containing composition from step (C4) by washing with an aqueous liquid, thereby removing either the imagewise exposed or imagewise unexposed regions, to produce an additional colored pattern; and optionally;

(C6) repeating, in order, steps (C1) to (C5) one or more times; wherein the adhesion force between any of the additional photosensitive layers prior to exposure to actinic radiation and its overlying additional support has a value less than each of F1 and F2 and is less than each of the adhesion forces between adhesive layers and adjacent photosensitive layers or colored patterns; wherein the adhesion force between said additional adhesive layer and said underlying first colored pattern has the value F5; the adhesion force between any of said additional adhesive layers and the underlying additional colored pattern has the value F5i; the adhesion force between any of said additional adhesive layers and the overlying additional colored pattern has the value F2i; the adhesion force between the uppermost additional colored pattern and said release surface of said transfer support has a value F3n; the adhesion force between the additional adhesive layer and the overlying additional photosensitive layer prior to exposure to actinic light has the value F6, and wherein each of F2, F3, F2i, F3n, F5, F5i and F6 is greater than F1; and each of F2, F2i, F4, F5, F5i is greater than F3n.

In the laminate-in-register process, after step (E), steps (A) through (E) are repeated at least once using a different aqueous permeable, colorant-containing composition, a different photosensitive element, and the element from step (E) as the transfer element in step (D).

The invention also provides an imaged element comprising, in order:

(1) a carrier element having a release surface, said carrier element being resistant to aqueous development;

(2) a first adhesive layer;

(3) a first colored pattern, resulting from the imagewise exposure and washout development of a first unpigmented, photosensitive layer comprising an aqueous liquid developable photosensitive composition and an overlying aqueous permeable colorant-containing composition, wherein the colorant-containing composition is present as a separate layer or absorbed into the first unpigmented, photosensitive layer; and (4) a transfer element having a release surface; wherein the adhesion force between the release surface of said carrier element and said adhesive layer has a value of F1, the adhesion force between said adhesive layer and said first colored pattern has a value of F2, and the adhesion force between said first colored pattern and said release surface of said transfer support has a value of F3; and wherein each of F2 and F3 is greater than F1, and F2 is greater than F3.

In a preferred embodiment, the liquid for development is water; the photosensitive material is an aqueous-processable derivative of polyvinyl alcohol containing photocrosslinkable groups selected from the group consisting of N-alkyl styrylpyridinium and N-alkyl styrylquinolinium; and the aqueous colorant-containing composition is an ink jet ink that is printed on or applied to the unpigmented, photosensitive layer using an ink jet printer.

DETAILED DESCRIPTION OF THE INVENTION

Figure 1:
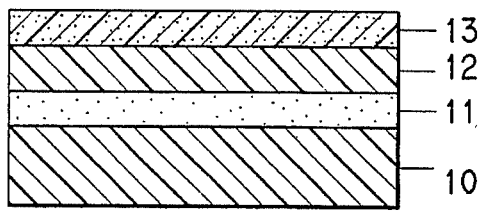
FIG. 1 is a schematic illustration of the photosensitive element used in the process of the invention having applied thereon at least one aqueous permeable colorant-containing composition.
Figure 2:
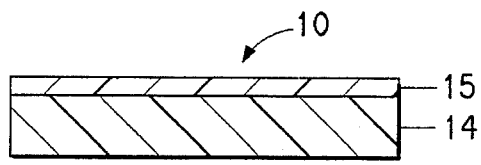
FIG. 2 is a schematic illustration of the carrier element used in the process of the invention.

In one embodiment of the invention, a single colored image on a permanent support is formed by applying at least one aqueous permeable colorant-containing composition to a photosensitive element comprising a carrier element having a release surface, a first adhesive layer, and an unpigmented, first photosensitive layer consisting essentially of an aqueous liquid developable photosensitive composition, wherein the aqueous permeable colorant-containing composition is applied to the photosensitive layer; imagewise exposing to actinic radiation the photosensitive element having applied thereon the permeable colorant-containing composition to form imagewise exposed and unexposed regions in the unpigmented, first photosensitive layer and the overlying permeable colorant-containing composition; developing the exposed element by washing with an aqueous liquid, thereby removing either the imagewise exposed or imagewise unexposed regions, to produce a first colored pattern; laminating to the exposed and developed element a transfer element having a release surface, wherein the release surface is adjacent to the first colored pattern; removing said carrier element having a release surface, revealing the adhesive layer; laminating the element so formed to a permanent support, wherein the adhesive layer is adjacent to the permanent support; and removing said transfer support having a release surface.

In another embodiment of this invention, a carrier element is used to build up a multicolored image consisting of multiple imaged color layers, each interleaved and bonded together with an adhesive layer. Multiple color images are built up on the carrier element by executing multiple imaging steps, respectively. After the multicolored image has been formed, a transfer element is employed to effect a double transfer of the multicolored image, ending with transfer of the colored image from the transfer element (which image is wrong-reading) to the permanent support to afford a right-reading image. This process of forming a multicolored surprint proof is called an expose-in-register process.

In still another embodiment of the invention, a multicolored surprint proof is formed by exposing and developing at least one additional photosensitive element comprising a carrier element having a release surface, an adhesive layer and an unpigmented photosensitive layer, and which has applied thereon at least one aqueous permeable colorant-containing composition, laminating in register the so formed colored image to a transfer element having a first colored image thereon, followed by removal of the carrier element having a release surface and lamination of the so formed multicolor image to a permanent support. This process of forming a multicolored surprint proof is called a laminate-in-register process.

This invention provides for high resolution, high quality, full color surprint proofs on virtually any proofing paper stock or other permanent support. It also provides for development during imaging with tap water as the liquid developer to minimize or eliminate concerns regarding toxicity, waste treatment, and corrosion. It also provides for color flexibility and the capability for addition of the colorant-containing composition only to the approximate areas where an image is desired. It also provides for the addition of more than one color to a single layer.

In practicing the process of the invention, at least four components are necessary: (I) a photosensitive element comprising in order an adhesive layer and a photosensitive layer on a carrier element having a release surface, (II) an aqueous permeable colorant-containing composition, (III) a transfer element, and (IV) a permanent support element. The carrier element having a release surface may comprise a carrier support and a release layer or a cushion layer. The transfer element having a release surface comprises a transfer support and at least one release layer or cushion layer. Additional photosensitive elements and additional colorant-containing compositions are also used in making multicolor images.

In order to facilitate understanding of the process of the invention, the individual components will be described in detail first.

PHOTOSENSITIVE ELEMENT

The photosensitive element is shown in FIG. 1. The element comprises, in order, a carrier element having a release surface (10), an adhesive layer (11), and a photosensitive layer (12).

Carrier Element

The carrier element having a release surface (10) may comprise a carrier support (14) and a surface layer (15) which may be a release layer or a cushion layer. If the material used as the carrier support has a release surface, e.g., polyethylene or a fluoropolymer, no additional surface layer is needed. The carrier surface layer (15) should have sufficient adhesion to the carrier support (14) to remain affixed to that support throughout all the process steps in the processes of the invention. The carrier surface layer should have sufficient adhesion to the adhesive layer to remain affixed thereto during aqueous development of the photosensitive layer. But at the same time, the adhesion of the carrier surface layer to the adhesive layer should be low enough to allow for removal of the carrier support and the carrier surface layer, if present, subsequent to the aqueous development steps. The relative adhesion balances will be discussed in greater detail below.

In the single color image process and the expose-in-register multicolor image process, the carrier element serves as a temporary receptor upon which the colored image, comprising one or more imaged colored layers interleaved with adhesive layers, can be constructed. The photosensitive layer with its overlying aqueous permeable colorant-containing composition is exposed and developed while on the carrier element.

The carrier support (14) can comprise almost any material which has reasonable stiffness, has dimensional stability, and is water resistant. Materials with sufficient stiffness and dimensional stability are those which are capable of supporting an image without allowing it to shift and misalign. The material used for the carrier support should have enough water resistance to allow for aqueous development of the photosensitive layer without warping or shrinking. The material used for the carrier support should also have sufficient heat and pressure resistance to withstand the various lamination steps. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The carrier support can also be a thin metal sheet or a paper substrate or synthetic paper which has been treated to be water resistant. The carrier support can be transparent, translucent or opaque. It can be colored and can have incorporated within materials such as antihalation dyes, etc. A preferred carrier support material is polyethylene terephthalate film.

The carrier support can have an antistat layer coated on one or both sides. This can be useful in reducing static when the carrier support is removed from the photosensitive element by peeling off, as will be discussed below. It is generally preferred to have an antistat layer coated on the back side of the carrier support, i.e., the side opposite from that on which the photosensitive layer is present. Materials which can be used as antistat materials are well known in the art.

The carrier support typically has a thickness of about 20 to about 250 micrometers (1.0 to 10 mils). A preferred thickness is about 55 to 200 micrometers (2 to 8 mils).

The release surface of the carrier element may be provided by a surface layer (15) which is selected from the group consisting of (i) a release layer and (ii) a cushion layer. Release layers are generally very thin layers which promote the separation of layers. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the carrier support, the layer generally has a thickness in the range of 0.5 to 10 micrometers.

The carrier release layer may also include materials such as antistats, colorants, antihalation dyes, optical brighteners, surfactants, plasticizers, coating aids, matting agents, and the like.

A second, and preferred, type of carrier surface layer (15) is a cushion layer having a release surface. The cushion layer is a deformable layer which is generally thicker than a release layer. Surprisingly, it was found that the incorporation of a carrier cushion layer on the carrier support resulted in several advantages in the process of the invention when forming multicolor images: the amount of mottle caused by incorporation of entrapped air during lamination steps was greatly reduced; lamination temperatures could be reduced; and the adhesion between colors was improved.

The carrier cushion layer should have a release surface to allow for separation of the carrier support and carrier cushion layer from the adhesive layer subsequent to aqueous development of the photosensitive layer. Some examples of suitable materials which can be used as the carrier cushion layer include ethylene/methacrylic acid copolymers and ionomers; ethylene/acrylic acid copolymers and ionomers; ethylene/vinyl acetate copolymers; ethylene homopolymers; propylene homopolymers; ethylene/propylene copolymers; ethylene/methacrylate copolymers; ethylene/methacrylic acid/isobutylacrylic acid ionomers; and the like. Mixtures of materials can also be used. Preferred materials for the carrier cushion layer are ethylene/methacrylic acid and ethylene/acrylic acid copolymers and ionomers. Such materials are commercially available as, e.g., Surlyn® 1601 (E. I. du Pont de Nemours and Company, Wilmington, Del.) and Iotek® 4080 (Exxon Chemical Co., Houston, Tex.).

The carrier cushion layer may also include materials such as antistats, colorants, antihalation dyes, optical brighteners, surfactants, plasticizers, coating aids, and the like. In general, these additional materials may constitute less than about 10% by weight, based on the total weight of the carrier cushion layer; preferably less than about 5% by weight. It can be advantageous to include a white pigment in the carrier cushion layer. This facilitates inspection of the colored image formed thereon.

The carrier cushion layer generally has a thickness in the range of about 12 to 150 micrometers (0.5 to 6 mils); preferably 35 to 65 micrometers (1.4 to 2.6 mils).

In order to ensure adequate adhesion of the carrier cushion layer to the carrier support, it is sometimes necessary to include one or more anchor layers between them. By "anchor layer" it is meant a layer that remains adhesively bonded to the layers on both sides, i.e., the layer above it and the layer below it. Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Any conventional adhesive materials can be used in the anchor layer or layers so long as they are not adversely affected by the aqueous development step. Suitable materials for use as the carrier anchor layer include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the carrier cushion layer and the carrier support. The anchor layer or layers can have incorporated therein materials such as antistats, colorants, antihalation dyes, optical brighteners, surfactants, plasticizers, coating aids, and the like.

The carrier anchor layer generally has a thickness in the range of 0.01 to 10 micrometers; preferably 0.05 to 5 micrometers. When more than one anchor layer is present, the total thickness of the layers is generally in the above range.

The carrier element may also be provided with a temporary coversheet (not shown). The temporary coversheet can comprise any material which affords adequate protection of the underlying adhesive layer and which cleanly releases from the adhesive layer by peeling. Preferred coversheets are self releasing films, such as polyethylene or polyethylene terephthalate. These films can be coated with release layers, such as silicone, so long as the release layer is removed cleanly with the film. The thickness of the temporary coversheet is not critical and typically is in the range of 25 to 250 micrometers (1 to 10 mils).

Adhesive Layer

The adhesive layer (11) remains affixed to the photosensitive layer throughout the process of the invention. This adhesive layer can be comprised of any suitable composition which has the necessary adhesion to the photosensitive layer and which does not interfere with the function of the photosensitive layer, such as, for example, might result from the leaching of components from the adhesive layer into the photosensitive layer or the resulting imaged layer. To provide a high resolution image, it is preferred that the adhesive layer be capable of holding onto a dot during processing; not stain the pigmented layer; and not block to other layers, e.g. paper, etc., both during and after proof assembly. Preferably, the adhesive layer is transparent and does not have any yellowness which may shift the color balance. It should be capable of easy lamination without trapping air bubbles which reduce image quality. It is preferred that the adhesive layer be capable of sliding easily over other layers, but not so easily that registration problems occur. The adhesive layer should, preferably, heat seal to other color films and adhesive layers, be scratch and abrasion resistant, in wet or dry form, and not crack or become brittle over time, or when folded, bent, etc. Sticking to components of the lamination or processing equipment is also undesirable.

As discussed above, adhesive materials for bonding different types of materials are well known in the art and discussions can be found in, e.g., *Handbook of Adhesives*, 2nd Edition, Irving Skeist, Ed. (Van Nostrand Reinhold Co., New York, 1977). The exact choice of adhesive will depend on the nature of the photosensitive layer, the carrier support and the release or cushion layers. Examples of some suitable types of adhesives which can be used include polyester resins and vinylacetate copolymers with ethylene and/or vinyl chloride.

Conventional additives listed earlier as additives for the cushioning and release layers may also be present in the adhesive layer.

The adhesive layer (11) generally has a thickness in the range of 0.1 to 10 micrometers; preferably 0.5 to 3 micrometers.

Unpigmented Photosensitive Layer

The photosensitive layer (12) comprises an aqueous liquid developable photosensitive composition for which exposure to actinic radiation results in a change in solubility. The photosensitive composition can be photoinsolubilizable, i.e., before exposure the photosensitive composition is removable from the carrier support by water or by aqueous solutions that consist essentially of water. After exposure, the composition is not removable from the carrier support by water or by aqueous solutions that consist essentially of water. Alternatively, the photosensitive composition can be photosolubilizable. In this latter case, before exposure the photosensitive composition is not removable from the support by water or by aqueous solutions that consist essentially of water. After exposure, the composition is removable from the support by water or by aqueous solutions that consist essentially of water.

Photoinsolubilization is generally achieved by photoinitiated polymerization and/or crosslinking reactions. The resulting change in physical properties of the compounds present, particularly the increase in molecular weight and/or network formation, insolubilizes the photosensitive material.

Derivatives of water soluble polymers, such as polyvinyl alcohol, which comprise pendant photocrosslinkable groups can be used to advantage in the photosensitive layer. On exposure these groups react to form crosslinks between different polymer chains. Photocrosslinkable polymers are described in A. Reiser, *Photoreactive Polymers: The Science and Technology of Resists*, Wiley, New York, 1989, pp 24–32. Typical photocrosslinkable groups are, for example, the cinnamyl, chalcone, alpha-phenylmaleimide, N-alkyl styrylpyridinium, and N-alkyl styrylquinolinium groups. Other aqueous developable systems are disclosed in Briney et al., U.S. Pat. No. 4,485,167 issued Nov. 27, 1984.

Derivatives of polyvinyl alcohol which comprise photocrosslinkable groups are preferred. Preferred polyvinyl alcohol derivatives are those which comprises N-alkyl styrylpyridinium or N-alkyl styrylquinolinium groups. Such polymers are described in K. Ichimura and S. Wantanabe, *J. Polym. Sci.*, Polym. Lett. Ed., 18, 613 (1980) and 20, 1411, 1419 (1982) as well as in Ichimura, U.S. Pat. Nos.: 4,272, 620, 4,287,335, 4,339,524, 4,564,580 and 4,777,114. The disclosure of these references is incorporated herein by reference.

Substituted aqueous-processable polyvinyl alcohol polymers are typically prepared by derivatization of saponified polyvinyl acetate with the appropriate photocrosslinking group. It is desirable for the polyvinyl acetate to be at least 70% hydrolyzed. Typically 88% saponified polyvinyl acetate is used, but polyvinyl acetate which is more or less highly saponified can be used provided the photosensitive layer is aqueous-processable. The photocrosslinkable group can be attached to the polyvinyl alcohol by any appropriate chemical linkage, such as an ester, ether, or acetal linkage. The acetal linkage is preferred. Typically the 0.5–10 mol % photocrosslinkable groups, preferably 1–4 mol %, are present. Although polymers containing higher amounts of photocrosslinkable groups typically cannot be made to be aqueous-processable, higher amounts of photocrosslinkable groups can be used, provided the photosensitive layer is aqueous-processable. The degree of polymerization of the polyvinyl alcohol, i.e., the number of monomer units in the polymer chain, is advantageously in the range of 400 to 3,000. When the polymerization degree is too low, the exposure time required for insolubilization is lengthened. When the polymerization degree is too large, the viscosity of solutions containing the polymer becomes so large that they are difficult to prepare and handle.

Another class of polyfunctional photoactivatable crosslinking agents are bis-azides. These compounds are typically aromatic bis-azides substituted with one or more ionic groups, such as sulfonate, carboxylate, sulfate, etc., to increase water solubility. Typical bis-azides are sodium 4,4'-diazidostilbene-2,2'-disulfonate, sodium 4,4'-diazidobenzalacetophenone-2-sulfonate, and sodium 4,4'-diazidostilbene-alpha-carboxylate. A preferred bis-azide is sodium 4,4'-diazidostilbene-2,2'-disulfonate. As will be apparent to those skilled in the art, equivalent results may be obtained from the use of bis-azides which contain other cations in place of sodium, such as, for example, potassium, ammonium, and substituted ammonium, such as, for example, ethyl ammonium, tetramethyl ammonium, etc.

Photosensitive diazo resins are another class of photosensitive materials. These materials typically consist of aromatic diazonium salts crosslinked with formaldehyde. Representative materials are: the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

Photosolubilization is generally achieved by photoinitiated conversion of materials to more soluble forms, plasticization reactions, depolymerization, uncoupling or uncrosslinking reactions. Systems based on o-quinone diazides and low molecular weight phenolformaldehyde polymers can be used to advantage. Upon exposure to ultraviolet radiation, the o-quinone diazide is converted to the readily dissolved indene carboxylic acid. A discussion of such systems can be found in A. Reiser, *Photoreactive Polymers: The Science and Technology of Resists,* Wiley, New York, 1989, pp 178–225. Useful photosolubilization chemistry is also disclosed in Chen et al., U.S. Pat. No. 5,071,731.

Other conventional additives can also be added to the photosensitive layer provided they are compatible with the other ingredients present in the layer, do not impart unwanted color to the final image, and do not adversely affect the action of the element required for the operation of either the imaging process or the multiple transfers required to transfer the image to a permanent support. In some cases separate photoinitiators are added. Other components can include, for example, polymeric binders, plasticizers, antihalation agents, optical brightening agents, release agents, surfactants, coating aids, matting agents, and the like.

Additives may be included in the photosensitive composition to improve the aqueous permeable, colorant-containing composition's penetration, absorption and/or fixation to the photosensitive layer. Matting agents added to the unpigmented photosensitive layer would be expected to provide a matte appearance to the layer and may also provide improved diffusibility of the colorant-containing composition into the unpigmented photosensitive layer.

The photosensitive material must be present in sufficient amount to solubilize or insolubilize the photosensitive layer on exposure to actinic radiation. The photosensitive composition must contain sufficient polymer, either as part of the photosensitive material and/or as added binder, to form a film when coated to form the photosensitive layer. Other ingredients may be present in amounts necessary to achieve their desired purposes, but not in such large amounts that they adversely affect the properties of the imaging system.

The composition of the photosensitive layer, expressed in percent by weight, based on the total weight of the photosensitive layer, is typically: binder 80–98%, preferably 85–96%; photosensitive material 2–10%, preferably 2–6% and other ingredients 0–10%. If no binder is present, i.e., the photosensitive material also functions as a binder, the composition is typically: photosensitive material 80–100%, preferably 90–100%; and other ingredients 0–20%.

The photosensitive layer generally has a thickness in the range of 0.1 to 10 micrometers; preferably 0.5 to 2 micrometers.

Preparation of the Photosensitive Element

The photosensitive element may be made by coating all of the layers, in order, onto the carrier support using any conventional coating and/or lamination techniques. Such processes are well known in the art. If the adhesive layer is coatable from a non-aqueous solution, the layers may be coated on the temporary coversheet (not shown) and laminated to the carrier element. If so, the temporary cover sheet may have a matte finish on its surface adjacent the photosensitve layer to impart a matte finish to the photosensitive layer when the temporary cover sheet is peeled off.

It is frequently convenient to prepare the photosensitive element by laminating together a preformed element to a carrier element. The preformed element may comprise the photosensitive layer and the adhesive layer sandwiched between a temporary coversheet (not shown) and a temporary support (not shown). The adhesive layer (11) and the photosensitive layer (12) have the same composition as discussed above.

The optional temporary coversheet is present to protect the element from being scratched or otherwise damaged prior to use. The temporary coversheet can be selected from the same materials described for the temporary coversheet in the carrier element.

The temporary support can comprise any dimensionally stable sheet material. Typically a polymeric film is used.

The support should be removable from the photosensitive layer prior to exposure to actinic radiation. At the same time, there must be sufficient adhesion between the photosensitive layer and the temporary support to allow for manufacture and handling of the photosensitive element. A separate release layer can be situated between the temporary support and the photosensitive layer, or a silicone release-treated film can be used. It is preferred to use a release layer. This allows for adjustment of the adhesion force between the photosensitive layer and the temporary support with respect to the other important adhesion forces which influence the process of the invention, as will be discussed in detail below.

The thickness of the temporary support must be sufficient to impart the necessary stiffness for handling and dimensional stability, but beyond that it is not particularly critical. The thickness is generally in the range of 25 to 250 micrometers (1 to 10 mils).

Preferably, the element having a temporary support and a temporary coversheet is prepared by coating each of the individual layers onto the temporary support. Preferably, the photosensitive layer is prepared by suspending or dissolving the ingredients in an appropriate solvent, preferably aqueous; coating onto the temporary support; and evaporating the solvent.

The photosensitive element shown in FIG. 1 may be prepared from the preformed element and the carrier element by laminating the two together. The two temporary coversheets are first removed and the two elements placed together such that the adhesive layer (11) is adjacent to the carrier element (10). The temperature and pressure used in the lamination step will depend on the composition of the adhesive layer (11) and the carrier element (10). The temporary support is then peeled off. When a release layer is present between the temporary support and the photosensitive layer, the release layer will be peeled off with the temporary support and will not remain on the photosensitive layer.

It will be clear to those skilled in the art that in order to remove the two temporary coversheets, the adhesion force between each of the temporary coversheets and their adjacent layers must be lower than the adhesion forces between all the other layers in their respective elements. It will also be clear that in order to remove the temporary support and the associated release layer, if present, after the lamination step, the adhesion force between the photosensitive layer and the temporary support or the release layer, if present, must be lower than the adhesion force between the photosensitive layer (12) and the adhesive layer (11), and the adhesion force between the adhesive layer (11) and the carrier element (10).

COLORANT-CONTAINING COMPOSITION

The aqueous permeable colorant-containing composition (13) is applied over the unpigmented photosensitive layer of the photosensitive element. It may be applied as a layer or may be absorbed into the photosensitive layer after its application. The colorant-containing composition (13) has to be aqueous permeable so as not to interfere with the development of the photosensitive layer after exposure. If present as a layer over the unpigmented photosensitive layer its thickness should be no greater than 4 micrometers, preferably no greater than 2 micrometers. The colorant used may be any material that is insoluble in the aqueous liquid used to develop the exposed, unpigmented photosensitive layer. The colorant can be one of the four standard colors, i.e., yellow, magenta, cyan, and black, or any other desired color. The colorants which can be used are well known to those skilled in the art. The colorant should be compatible with the photosensitive layer and preferably should not strongly absorb radiation in the spectral range in which the photosensitive composition absorbs radiation. Preferred colorants are pigments which are dispersible in water.

The colorant must be present in a sufficient amount to uniformly color the image to a sufficient optical density, but not in such a large amount that if it were absorbed into the photosensitive layer after its application, would adversely affect the properties of the photosensitive layer, for example, photospeed, adhesion, etc., needed for the operation of the imaging system. For surprint proofs, optical densities between 0.5 and 2 are desirable. Other ingredients may be included in the colorant-containing composition to improve its penetration, absorption and or fixation to the photosensitive layer provided they do not adversely affect the photosensitive layer's imaging function or the colorant's desired color. Water insoluble binders may be present in the aqueous permeable colorant-containing composition to improve coatability and/or water-fastness of the image.

The aqueous permeable colorant-containing composition (13) which typically comprises a colorant and water may be coated, laminated, sprayed or printed onto the unpigmented photosensitive layer. In the preferred embodiment, the aqueous permeable colorant-containing composition (13) is an ink jet ink and is applied using an ink jet printer. The ink jet ink comprises an aqueous carrier medium and a colorant which may be a pigment dispersion or a dye. If the colorant is a dye, it must be rendered insoluble by known techniques, e.g. encapsulation, so it is not washed away in the development step. Reactive dyes that are capable of reacting with the photosensitive material upon exposure to UV radiation are also useful in this invention. A dye dispersion may lso be used. The pigment dispersion comprises a pigment and a dispersing agent, which preferably is a polymeric compound.

INK JET INK

The aqueous permeable colorant-containing composition (13) which may be applied as an ink jet ink comprises an aqueous carrier medium and a colorant which may be a pigment dispersion or a dye.

Aqueous Carrier Medium

The aqueous carrier medium is water or a mixture of water and at least one water-soluble organic component. Deionized water is commonly used. Representative examples of water-soluble organic solvents are disclosed in Ma et al., U.S. Pat. No. 5,085,698, the disclosure of which is incorporated herein by reference. Selection of a suitable mixture of water and water-soluble organic solvent depends upon requirements of the specific application, such as desired surface tension and viscosity, the selected pigment, drying time of the pigmented ink jet ink, and the type of photosensitive layer onto which the ink will be printed. A mixture of a water-soluble organic solvent having at least 2 hydroxyl groups, e.g. diethylene glycol, and deionized water is preferred as the aqueous medium. In the case of a mixture of water and diethylene glycol, water could be present in the amount of between 30% and 95%, preferably 60% to 95%, by weight based on the total weight of the aqueous carrier medium.

Colorant

The colorant useful in the invention may be a pigment dispersion or a dye. A pigment is a colorant that is applied in an insoluble particulate state. A dye is a colorant that is typically in a soluble state but will be insolubilized by known techniques such as encapsulation prior to use in this invention. Reactive dyes that are capable of reacting with the photosensitive material upon exposure to UV radiation are also useful in this invention. Disperse dyes may also be used. The term pigment dispersion, as is known in the art and as used herein, refers to a mixture of a pigment and a dispersing agent. Preferably, the dispersing agent is a polymeric compound.

Pigments

Useful pigments for the dispersion comprise a wide variety of organic and inorganic pigments, alone or in combination. For ink jet ink applications, the pigment particles need to be sufficiently small to permit free flow of the ink through the ink jet printing device, especially at the ejecting nozzles that usually have a diameter ranging from 10 to 50 microns. The particle size also has an influence on the pigment dispersion stability, which is critical throughout the life of the ink. Brownian motion of minute particles will help prevent the particles from flocculation. It is also desirable to use small particles for maximum color strength and gloss. The range of useful particle size is approximately 0.005 to 15 microns. Preferably, the pigment particle size should range from 0.005 to 1 micron.

The selected pigment may be used in dry or wet form such as presscake. Representative commercial dry and presscake pigment that may be used in practicing the invention are disclosed by Ma et al. in U.S. Pat. No. 5,085,698, which is incorporated herein by reference.

In the case of organic pigments, the ink may contain up to approximately 30% pigment by weight, but will generally be in the range of approximately 0.1 to 15%, preferably approximately 0.1 to 5%, by weight of the total ink composition. If an inorganic pigment is selected, the ink will tend to contain higher weight percentages of pigment because inorganic pigments generally have higher specific gravities than organic pigments.

Dispersant

Polymeric dispersants are the preferred dispersants for pigments. Polymeric dispersants suitable for practicing this invention include random copolymers, block copolymers such as AB, BAB, and ABC block copolymers, and graft copolymers.

In AB or BAB block copolymers, the A block is a hydrophobic homopolymer or copolymer which serves to link with the pigment and the B block is a hydrophilic homopolymer or copolymer, or salts thereof, which serves to disperse the pigment in the aqueous medium. Such polymeric dispersants and their synthesis are disclosed in Ma et al., U.S. Pat. No. 5,085,698, issued Feb. 4, 1992, the disclosure of which is incorporated herein by reference.

ABC triblock copolymers are also useful as pigment dispersants. In the ABC triblock copolymer, the A block is a polymer soluble in water, the B block is capable of binding to the pigment, and the C block is compatible with the organic components in the ink. ABC triblock copolymers and their synthesis are disclosed in Ma et al., U.S. Ser. No. 07/838,181 filed Feb. 20, 1992, the disclosure of which is incorporated herein by reference.

Although random copolymers can be used as dispersing agents, they are not as effective in stabilizing pigment dispersions as the block copolymers, and therefore are not preferred.

Dyes

Dyes which are commonly used in aqueous ink jet inks, such as, for example, acid dyes, basic dyes, direct dyes, food dyes, and reactive dyes are suitable colorants for the ink compositions of the present invention provided they are rendered insoluble by techniques known to those skilled in the art, e.g. encapsulation. Disperse dyes may also be suitable as colorants.

The color and amount of dye used in the ink are largely a function of choice, being primarily dependent upon the desired color of the print achieved with the ink and the dye's strength. Low concentrations of dyes may not give adequate color vividness. High concentrations may result in poor printhead performance or unacceptably dark colors.

The dye may be present in the amount of 0.01 to 20%, by weight, preferably 0.05 to 8%, by weight, more preferably 1 to 5% by weight, based on the total weight of the ink.

Other Ingredients

Any material that would provide swelling of the photosensitive layer without having a deleterious effect on it would be useful for improving diffusibility of the ink into the photosensitive layer, e.g. water, surfactants, etc. Surfactants alter surface tension and would therefore be expected to maximize penetration of the ink into the photosensitive layer. However, they may also destabilize the pigment dispersion for pigmented inks. The choice of a specific surfactant is also highly dependent on the type of photosensitive layer in the photosensitive element to be printed. One skilled in the art can select the appropriate surfactant and the appropriate amount for a specific element to be printed. Thermal crosslinking agents may be added to the ink or the photosensitive layer to improve adhesion of the ink to the photosensitive layer and prevent it from being washed off during the development step.

Biocides, sequestering agents such as EDTA, humectants, viscosity modifiers, and other acrylic or non-acrylic polymers may also be added to improve various properties of the inks.

Ink Preparation and Ink Properties

The aqueous permeable, colorant-containing ink compositions of the invention are prepared as described in Ma et al., U.S. Pat. No. 5,085,692 issued Feb. 4, 1992.

Jet velocity, separation length of the droplets, drop size, and stream stability are greatly affected by the surface tension and the viscosity of the ink. Inks suitable for use with ink jet printing systems should have a surface tension in the range of about 20 dyne/cm to about 70 dyne/cm and, more preferably, in the range of 25 dyne/cm to about 70 dyne/cm at 20° C. Acceptable viscosities are no greater than 20 cP, and preferably below 10 cP at 20° C. The ink has physical properties compatible with a wide range of ejecting conditions, i.e., driving voltage, driving frequency, and pulse width for thermal ink jet printing devices, driving frequency for the piezo element for either a drop-on-demand device or a continuous device, and the shape and size of the nozzles, etc. They may be used with a variety of ink jet printers such as continuous, piezoelectric drop-on-demand, and thermal drop-on-demand, and are particularly adapted for use in thermal ink jet printers. The inks have excellent storage stability for a long period and do not clog the nozzles. Drying of the ink on the photosensitive layer can be carried out rapidly and accurately by means known to those skilled in the art.

TRANSFER ELEMENT

The function of the transfer element having a release surface (16) is to serve as a temporary receptor to receive the colored image after it has been formed on the carrier support and to provide adequate support for the image to maintain its integrity until it has been transferred to the permanent support.

Figure 3:
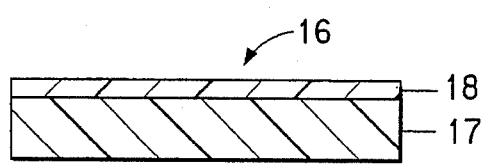
FIGS. 3 and 4 are schematic illustrations of alternate embodiments of the transfer element which may be used in the process of the invention.
Figure 4:
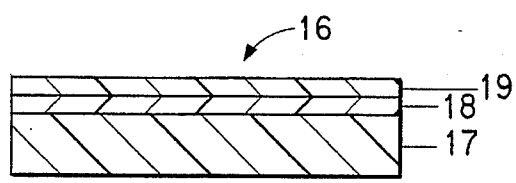

Representative transfer elements are shown in FIGS. 3 and 4. As shown in FIG. 3, the element may comprise, in order, an optional temporary coversheet (not shown), a transfer surface layer (18), and a transfer support (17). Optionally, the transfer element may comprise a transfer support (17) and two transfer surface layers (18) and (19). However, if a material having a release surface is used as the transfer support (e.g. polyethylene or a fluoropolymer) no additional release layer is needed.

The transfer support (17) may comprise almost any material which has reasonable stiffness and dimensional stability. Materials with sufficient stiffness and dimensional stability are those which are capable of supporting an image without allowing it to shift and misalign. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The transfer support can also be a thin metal sheet or a paper substrate or synthetic paper. A preferred transfer support material is polyethylene terephthalate film. The transfer support typically has a thickness of about 20 to about 250 micrometers (1.0 to 10 mils). A preferred thickness is about 75 to 200 micrometers (3 to 8 mils).

The transfer surface layers (18) and (19) are selected from the group consisting of (i) a release layer and (ii) a cushion layer. The transfer surface layer (18) should have sufficient adhesion to the transfer support to remain affixed to that support throughout all the process steps in the process of the invention. At the same time, the adhesiveness of the transfer surface layer should be carefully balanced with the adhesiveness of the carrier surface layer in order to carry out the transfer steps in the process of the invention. The relative adhesion balances will be discussed in greater detail below.

In the embodiment wherein the transfer support (17) has two layers thereon, adhesion of the layer (18) adjacent the support (17) may be greater than its adhesion to layer (19). Layer (19) may have greater adhesion to the exposed and developed photosensitive layer (12') having thereon the aqueous colorant-containing composition (13') so that when the transfer support is peeled off, layer (18) is removed with the support and layer (19) is left behind. The two layer transfer element may also be designed wherein both layers have greater adhesion to the support (17) than the developed photosensitive layer (12') having thereon the aqueous colorant-containing composition (13') so that when the transfer support (17) is peeled off both layers (18) and (19) are removed with it. The two layer transfer element may also be designed wherein both layers have greater adhesion to the developed photosensitive layer (12') having thereon the aqueous colorant-containing composition (13') than the support (17) so that when the transfer support (17) is peeled off both layers (18) and (19) are left behind on the developed photosensitive layer (12') having thereon the aqueous colorant-containing composition (13').

As discussed above in conjunction with the carrier surface layer, release layers are generally very thin layers which promote the separation of layers. Materials useful as release layers are well known in the art. Release layers discussed earlier with regard to the carrier element are also useful here as long as the adhesion balances are met. Those which can be used as the transfer surface layer(s) include, for example, silicones; vinyl chloride polymers and copolymers; vinyl acetate polymers and copolymers; plasticized polyvinyl alcohols; etc. The release surface may constitute the transfer surface layer (18) or transfer surface layers (18) and (19). When a separate release layer or layers are coated onto the transfer support, the layer(s) generally has a thickness in the range of 1 to 10 micrometers.

The preferred type of transfer surface layer is a cushion layer having a release surface. As with the carrier cushion layer, the transfer cushion layer is a deformable layer which is generally thicker than a release layer.

The transfer cushion layer should have a release surface to allow for separation of the transfer support and transfer cushion layer from the temporary coversheet (not shown), and from any layers which are subsequently laminated to the transfer cushion layer. As mentioned above, the composition of the transfer cushion layer should be chosen so as to produce the appropriate adhesiveness relative to the release surface of the carrier cushion layer. Examples of some suitable materials which can be used as the transfer cushion layer include ethylene/vinyl acetate copolymers; ethylene/methacrylic acid copolymers and ionomers, generally having a higher methacrylic acid content than when used as a carrier cushion layer; ethylene/acrylic acid copolymers and ionomers, generally having a higher acrylic acid content than when used as a carrier cushion layer; ethylene/methacrylate copolymers; ethylene/methacrylic acid/isobutylacrylic acid ionomers, generally having a higher methacrylic acid and isobutylacrylic acid content than when used as a carrier cushion layer; and the like. Mixtures of materials can also be used. Preferred materials for the transfer cushion layer are ethylene/vinyl acetate copolymers. The transfer cushion layer can also include materials such as surfactants, plasticizers, coating aids, and the like. In general, colorants, antihalation dyes, optical brightener, etc., are not used in the transfer cushion layer as they serve no added purpose in this layer.

The transfer cushion layer generally has a thickness in the range of about 25 to 150 micrometers (1 to 6 mils); preferably 75 to 125 micrometers (3 to 5 mils).

In order to ensure adequate adhesion of the transfer cushion layer to the transfer support, it is sometimes necessary to include one or more anchor layers between them. Adhesive materials for bonding different types of materials are well known in the art and discussions can be found in, e.g., *Handbook of Adhesives*, 2nd Edition, Irving Skeist, Ed. (Van Nostrand Reinhold Co., New York, 1977). Any conventional adhesive materials can be used in the anchor layer or layers. Suitable materials for use as the transfer anchor layer include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the transfer cushion layer and the transfer support. The anchor layer or layers can have incorporated therein materials such as antistats, colorants, surfactants, plasticizers, coating aids, and the like.

The transfer anchor layer generally has a thickness in the range of 0.1 to 10 micrometers; preferably 0.5 to 2 micrometers. When more than one anchor layer is present, the total thickness of the layers is generally in the above range.

The optional temporary coversheet is present to protect the underlying layers, if necessary, and must be easily removable. It can be selected from any of the materials discussed above that are useful as the temporary coversheet for carrier element.

PERMANENT SUPPORT ELEMENT

One advantage of the process of this invention is that the permanent support for the final colored image can be chosen from almost any sheet material desired. For most proofing applications a paper support is used, preferably the same paper on which the image will ultimately be printed. Virtually any paper stock can be used. Other materials which can be used as the permanent support include cloth, wood, glass, china, most polymeric films, synthetic papers, thin metal sheets or foils, etc. Almost any material which will adhere to the adhesive layer (11) can be used as the permanent support.

PROCESS STEPS

The process of the invention may be used to produce a single color image on a permanent support or it may be used to make a multicolor image on a permanent support using either the exposure-in-register process or the laminate-in-register process.

Single Color Image

In the process of producing a single color image on a permanent support, the colored image is first built up on the carrier support by exposing and developing by washout, an unpigmented photosensitive layer (12) having provided thereon at least one aqueous permeable, colorant-containing composition (13), a transfer element having a release surface (16) is laminated thereto, and the carrier element is peeled off and the element is laminated to the permanent support (20).

Step A:

The element shown in FIG. 1 is prepared by applying at least one aqueous permeable, colorant-containing composition (13) to a photosensitive element comprising, in order, a carrier element having a release surface (10), an adhesive layer (11), a first photosensitive layer (12), wherein the colorant-containing composition is adjacent to the first photosensitive layer (12). The colorant-containing composition (13) may be applied by coating, spraying, laminating or printing. Preferably, the composition (13) is printed using an ink jet printer. Advantages of the invention are that the colorant-containing composition need not be applied to the whole surface of the first photosensitive layer and more than one colorant-containing composition can be applied to the first photosensitive layer. The colorant-containing composition need only be applied in the approximate areas where an image is to be formed in Steps B and C.

Step B:

The element shown in FIG. 1 is exposed to actinic radiation which is absorbed by the photosensitive composition to activate the imaging reaction in conventional fashion. "Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive composition, may also be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

The element is exposed to actinic radiation, typically through a separation transparency with the emulsion side of the transparency in contact with the aqueous permeable, colorant-containing composition, if it is present as a layer on the photosensitive layer, or the photosensitive layer if the aqueous permeable, colorant-containing composition is absorbed into the photosensitive layer. Exposure is conveniently carried out in a standard vacuum frame to ensure good contact between the transparency and the photosensitive layer with its overlying aqueous permeable colorant-containing composition.

Step C:

The next step is to develop the unpigmented photosensitive layer and its overlying aqueous permeable, colorant-containing composition by washing with an aqueous liquid. When the photosensitive layer is photoinsolubilizable, the aqueous liquid removes only the unexposed areas of the photosensitive layer and its overlying aqueous permeable, colorant-containing composition. When the photosensitive layer is photosolubilizable, the aqueous liquid removes only the exposed areas of the photosensitive layer and its overlying aqueous permeable, colorant-containing composition. As a result of the development step, a first colored pattern comprised of (12') and (13') is formed.

It is preferred that the development step be effected using ordinary tap water or the like to minimize concerns regarding toxicity, waste treatment, and corrosion. Development can either be done manually or using automated machines. It can be carried out at elevated temperatures, but in most cases room temperature is preferred.

Figure 5:
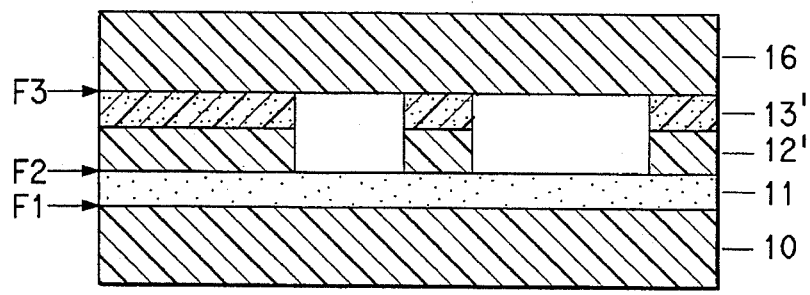
FIG. 5 is a schematic illustration of a single-color intermediate imaged element.

Step D:

The next step in the process is to laminate the transfer element (16), shown in FIGS. 3 and 4, to the element formed above, as shown in FIG. 5. The temporary coversheet, if present, is removed and the two elements are laminated together such that the transfer surface layer (18) in FIG. 3, transfer surface layer (19) in FIG. 4 or the transfer element having a release surface (16) shown in FIG. 5 is adjacent to the first colored pattern, i.e., the developed photosensitive layer and its overlying aqueous permeable, colorant-containing composition comprised of (12') and (13') as illustrated in FIG. 5.

The resulting element, called the intermediate imaged element, has the structure shown in FIG. 5. The adhesion forces between the individual layers have the following values:

F1=the adhesion force between the carrier support (10) and the adhesive layer (11);

F2=the adhesion force between the adhesive layer (11) and the developed photosensitive layer (12');

F3=the adhesion force between the first color pattern comprised of at least one developed aqueous permeable colorant-containing composition (13') and a developed photosensitive layer (12') and the transfer element having a release surface (16);

Step E:

The next step in the process is to remove the carrier element having a release surface (10). Thus the image is transferred to the transfer element. This step is accomplished by peeling the transfer element and the carrier element apart. In order to obtain the desired result, the adhesion values F2 and F3 must each individually be greater than the adhesion value F1.

Figure 6:
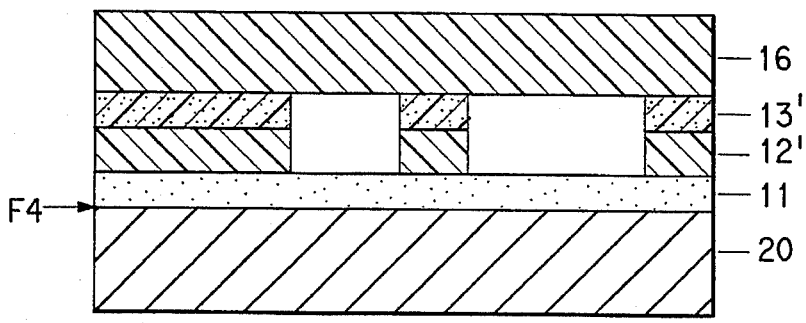
FIG. 6 is a schematic illustration of a single-color image on a permanent support prior to removal of the transfer element.

Step F:

The next step in the process is to laminate the permanent support (20) to the element from above, such that the permanent support (20) is adjacent to the adhesive layer (11) as illustrated in FIG. 6. The adhesion force between the permanent support (20) and the adhesive layer (11) has a value F4.

Step G:

The next step in the process is to remove the transfer element having a release surface (16), thereby transferring the image to the permanent support. This step is accomplished by peeling the transfer support and the permanent support apart. In order to obtain the desired result, the adhesion values F2 and F4 must each individually be greater than the adhesion value F3.

Multicolor Image Formation—Expose-in-register Process

When an image having more than one color is to be formed using the expose-in-register process, the process begins with steps A through C as described above, to form a first colored pattern. This is followed by steps C1 through C6 prior to step D.

Figure 7:
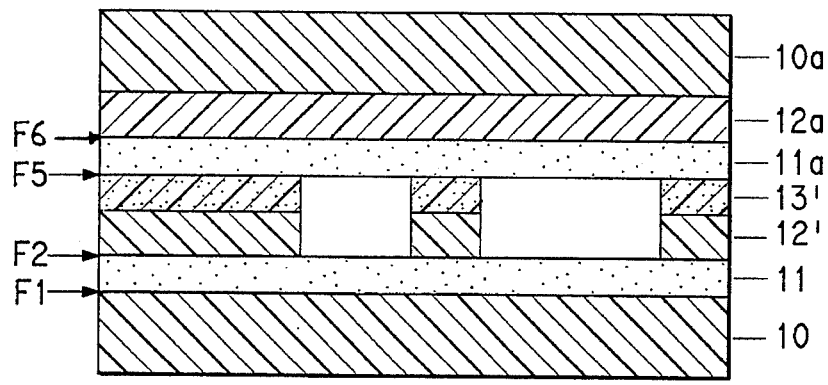
FIG. 7 is a schematic illustration showing an additional photosensitive element having in order, an adhesive layer, a photosensitive layer and a carrier element present on the first colored pattern containing element after step (C) using the expose-in-register process.

Step C1:

The next step in the process of forming a multicolor image is to laminate an additional unpigmented photosensitive element to the developed element from step C above. The additional element as shown in FIG. 7, has an additional support (10a), an underlying additional photosensitive layer (12a), and an underlying additional adhesive layer (11a)

which is adjacent to and overlying the first colored pattern comprised of the aqueous colorant containing composition (13') and its underlying photosensitive layer (12').

The adhesion forces between the layers have the values F1 and F2 as defined above, and in addition:

F5=the adhesion force between the first colored pattern comprised of (12') and (13') and the overlying additional adhesive layer (11a).

F6=the adhesion force between the additional adhesive layer (11a) and the overlying additional photosensitive layer (12a) prior to exposure to actinic light.

F7=the adhesion force between the additional photosensitive layer (12a) prior to exposure to actinic light and the overlying additional support (10a).

Step C2:

The additional support (10a) is removed from the additional photosensitive layer (12a). In order to obtain the desired result, the adhesion values F1, F2, F5, and F6, must each individually be greater than the adhesion value F7.

Figure 8:
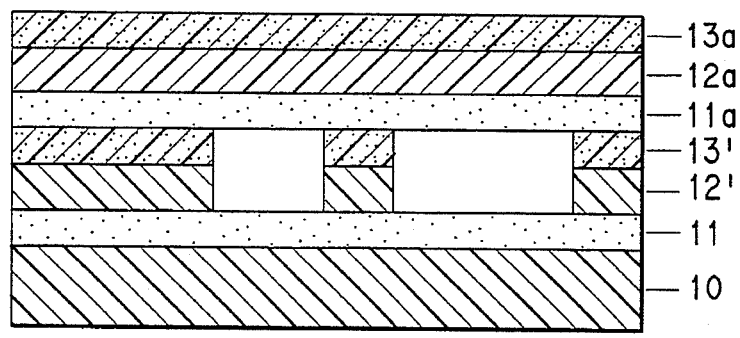
FIG. 8 is a schematic illustration showing the first colored pattern containing element after step (C) having in order, an adhesive layer, a photosensitive layer and a aqueous permeable colorant-containing composition present on it using the expose-in-register process.

Step C3:

As shown in FIG. 8, at least one additional aqueous permeable, colorant containing composition (13a) is then applied to the additional photosensitive layer (12a).

Step C4:

The next step in the process is to imagewise expose the additional photosensitive layer (12a) with its overlying additional aqueous permeable, colorant containing composition (13a) in register with the first colored pattern comprised of (12') and (13'). Suitable registration techniques are well known in the art and include pin and bar registration. The exposure is carried out as described in Step B.

Step C5:

The next step in the process is to develop the element from step C4 using aqueous washout development as described in step C. This results in the formation of a second colored pattern comprised of (12a') and (13a').

Figure 9:
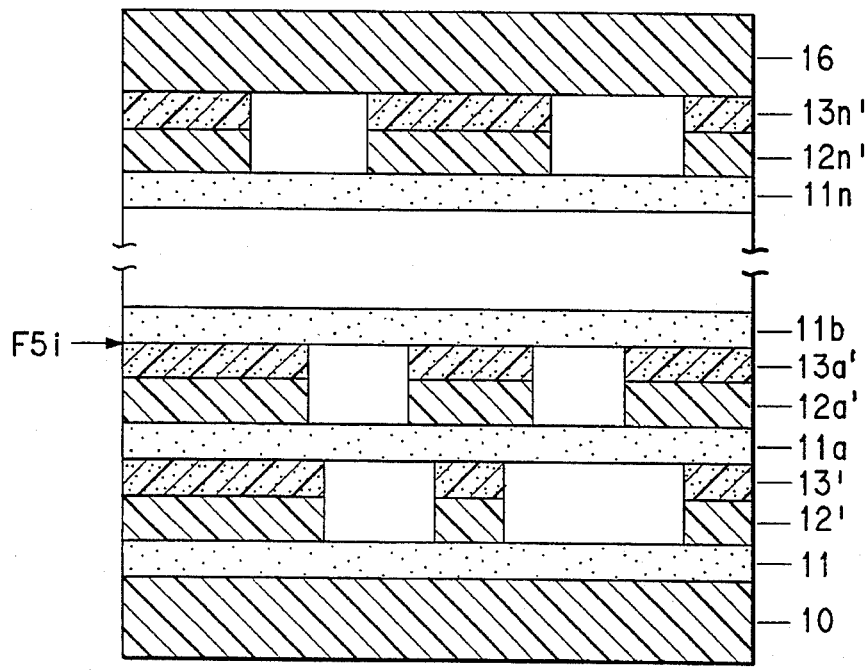
FIG. 9 is a schematic illustration of a multicolor intermediate imaged element using the expose-in-register process.

Step C6:

Steps C1 to C5 are repeated in order, one or more times to provide additional colors to the image. These steps are carried out using additional unpigmented elements and additional aqueous permeable, colorant containing compositions. The unpigmented element has an additional adhesive layer (11b) and colored pattern (not shown), through the nth element having an additional adhesive layer (11n) and an overlying colored pattern comprised of (12n') and (13n') as shown in FIG. 9. In each lamination step the unpigmented photosensitive element element described in Step C1 is laminated to the element from Step C5 such that the additional adhesive layer is adjacent to and overlying the outermost colored pattern. It will be appreciated that for each repetition of Step C3 in which the additional temporary support is removed, the adhesion force between the additional temporary support and the underlying unexposed additional photosensitive layer is less than the adhesion forces between all of the other layers in the element.

Step D:

As illustrated in FIG. 9, the element from Step C6 is then laminated to the transfer element having a release surface (16) such that its release surface is adjacent to the outermost colored pattern comprised of (12n') and (13n'). The resulting laminated element has a first colored pattern (12') and (13') and n additional colored patterns. The adhesion forces between the layers have the values F1, F2, F3 as defined above, and in addition:

F2i=the adhesion force between the additional adhesive layer 11a and the overlying additional color pattern comprised of (12a') and (13a').

F5i=the adhesion force between the additional colored pattern comprised of (12a') and (13a') and the overlying additional adhesive layer (11b).

F3n=the adhesion force between the uppermost additional colored pattern comprised of (12n') and (13n') and the transfer element (16).

In most cases, the same photosensitive composition will be used for all the photosensitive layers, and the same adhesive composition will be used for all the adhesive layers.

Step E:

The carrier element (10) is then removed. Adhesion values F2, F3, F2i, F3n, F5 and F5i must be greater than the adhesion value F1 to achieve this result.

Figure 10:
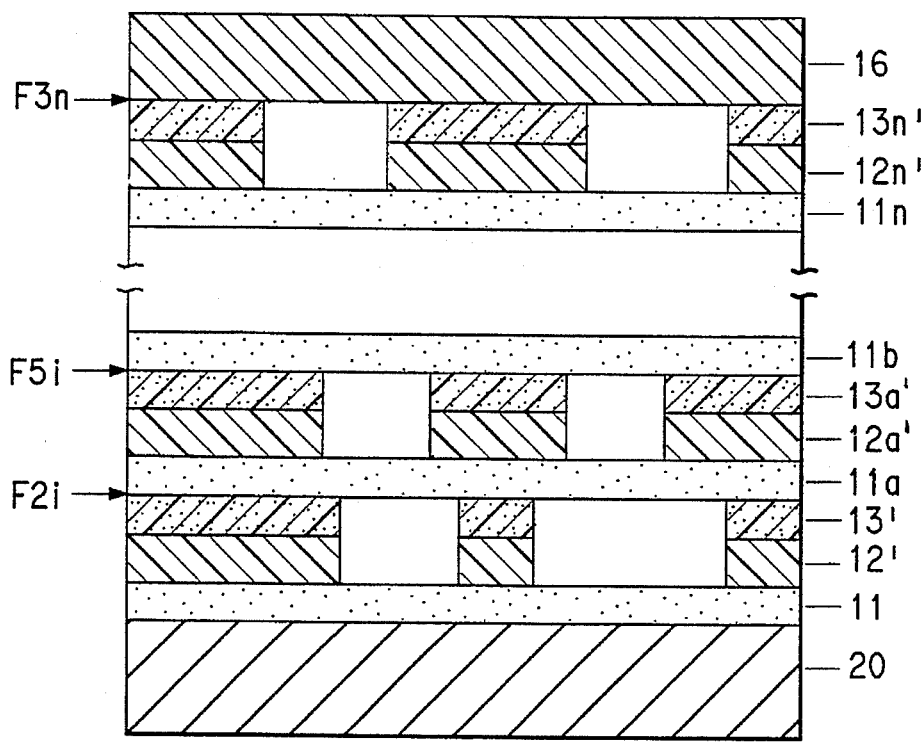
FIG. 10 is a schematic illustration of a multicolor image on a permanent support prior to removal of the transfer element using the expose-in-register process.

Step F:

Permanent support (20) is then laminated to the element from Step E, such that the permanent support is adjacent to the adhesive layer (11). This results in the structure shown in FIG. 10. The adhesion force between the permanent support (20) and the adhesive layer (11) has a value F4, as previously defined.

Figure 11:
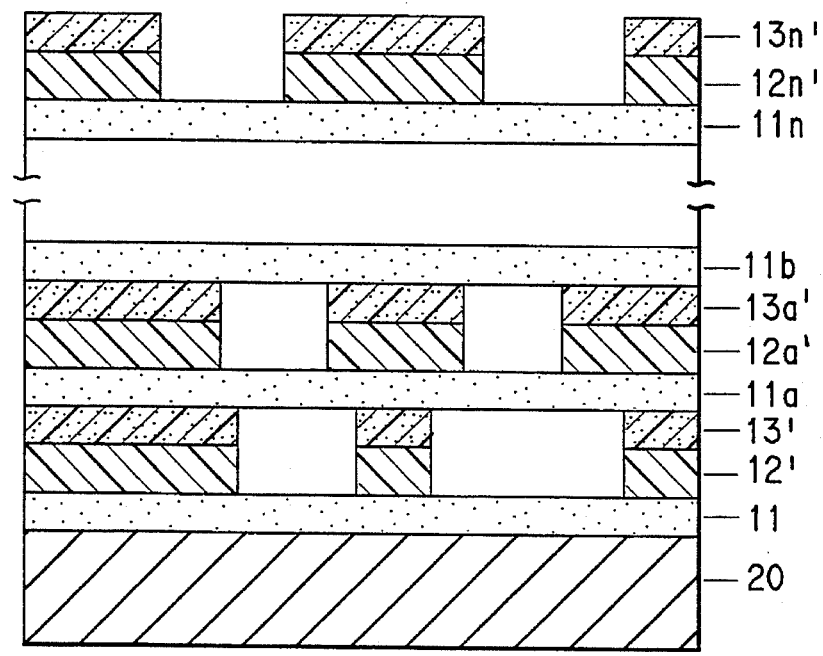
FIG. 11 is a schematic illustration of a final multicolor image on a permanent support formed using the expose-in-register process.

Step G:

Transfer element having a release surface 16 is then removed, thereby transferring the image to the permanent support as illustrated in FIG. 11. This step is accomplished by peeling the transfer element and the permanent support apart. In order to obtain this result, adhesion values F2, F2i, F4, F5, and F5i each are greater than the adhesion value F3n. In the embodiment shown in FIG. 11 no additional layers have been added to the image structure as a result of the transfer steps. The only layers present, other than the permanent support, are colored pattern comprised of (12') and (13'), (12a') and (13b'), and (12n') and (13n') and associated adhesive layers (11), (11a) and (11n).

Multicolor Image Formation—Laminate-in-register Process

Figure 12:
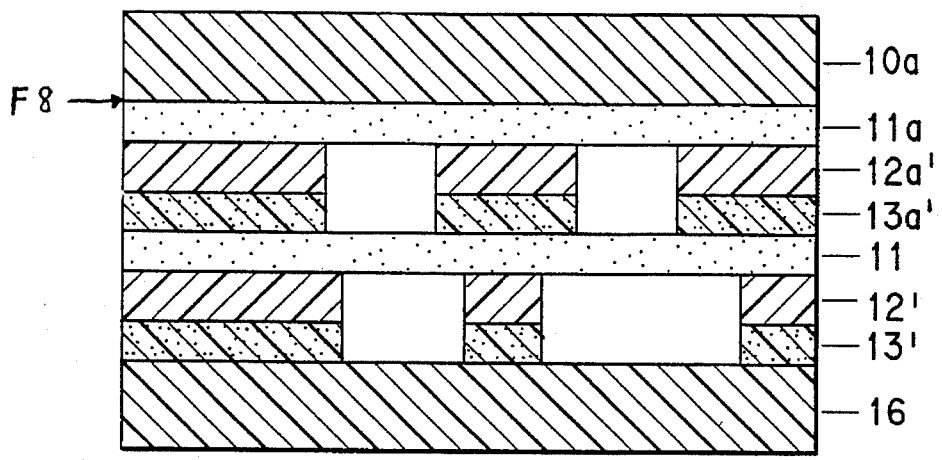
FIG. 12 is a schematic illustration of a two color intermediate element using the laminate-in-register process.

When an image having more than one color is to be formed using the laminate-in-register process, the process begins with steps A through E as described above, to form a first colored pattern on a transfer element. This is shown in FIG. 5 with the carrier element that is removed in Step E still intact. Steps A–E are repeated to transfer an additional colored pattern comprising at least one aqueous permeable colorant-containing composition (13a'), and its underlying unpigmented photosensitive layer (12a') formed by exposure and development of the element shown in FIG. 1, and an underlying adhesive layer (11a) present on a carrier element (10a) to the transfer element containing a first colored pattern comprising at least one aqueous permeable colorant-containing composition (13'), and its overlying unpigmented photosensitive layer (12') and an overlying adhesive layer (11) as shown in FIG. 12.

Figure 13:
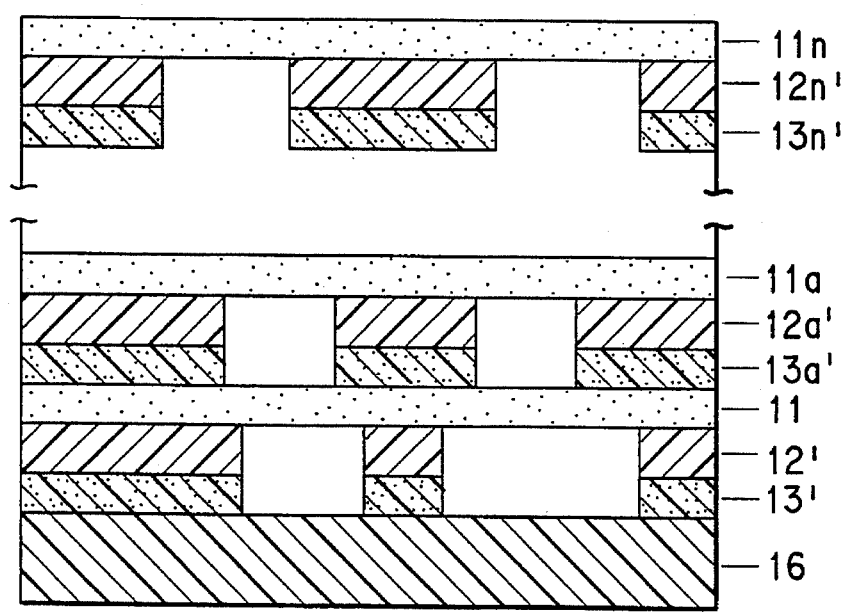
FIG. 13 is a schematic illustration of a multicolor intermediate element using the laminate-in-register process.
Figure 14:
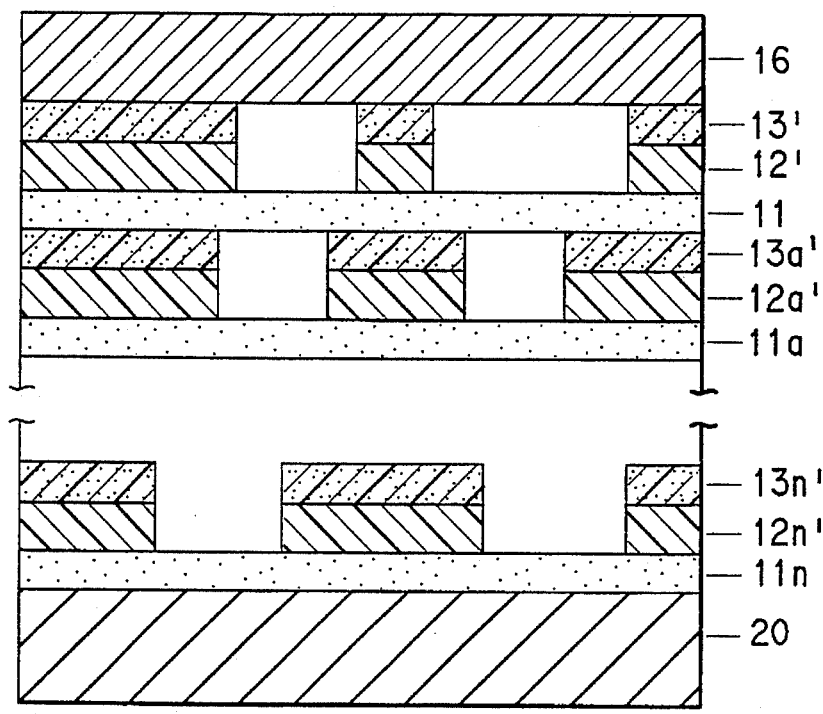
FIG. 14 is a schematic illustration of a multicolor image on a permanent support prior to removal of the transfer element using the laminate-in-register process.
Figure 15:
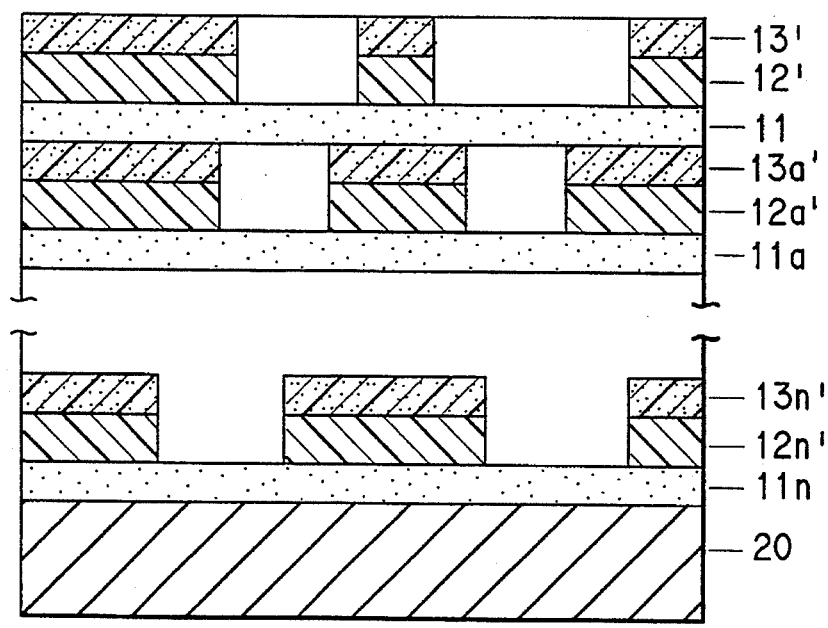
FIG. 15 is a schematic illustration of a final multicolor image on a permanent support formed using the laminate-in-register process.

Steps A–E may be repeated n times resulting in an element similar to that shown in FIG. 13 with adhesive layer (11n) being the outermost layer and having an underlying colored pattern comprised of the developed unpigmented photosensitive layer (12n') and the developed aqueous premeable colorant-containing composition (13n'). As shown in FIG. 14, the multicolor image on the transfer element (16) is transferred to a permanent receptor (20) followed by the removal of the transfer element. The final multicolor proof formed is shown in FIG. 15.

The adhesion forces between the critical individual layers have the following values:

F8=the adhesion force between the carrier support (10*a*) and the adhesive layer (11*a*);

F3=the adhesion force between the first color pattern comprised of at least one developed aqueous permeable colorant-containing composition (13') and a developed photosensitive layer (12') and the transfer element having a release surface (16).

F4=the adhesion force between the permanent support (20*b*) and the adhesive layer (11).

The adhesion force F3 and adhesion forces between all colored patterns and adjacent adhesive layers is greater than the adhesion force F8. The adhesion force F4 and adhesion forces between all colored patterns and adjacent adhesive layers is greater than the adhesion force F3.

It should be noted that both the carrier element and the transfer element of the present invention can be used repeatedly to form several colored or multicolored images.

INDUSTRIAL APPLICABILITY

The elements of this invention are useful for preparing colored images. These images are particularly useful in the graphic arts field, especially in the area of color proofing wherein proofs are prepared to predict the images produced by printing.

The advantageous properties of this invention can be observed by reference to the following examples which illustrate, but do not limit, the invention.

EXAMPLES

| GLOSSARY | |
|---|---|
| Aurora Pink ® EPX-11 | Aqueous pigment dispersion; Day-Glo Color Corporation |
| Denka ® LAC TL-03 | Vinyl chloride/vinyl acetate copolymer; Denki Kagaku Kogyo Kabushiki Kaisha |
| Dryer 900 | P-Toluenesulfonic acid |
| Eastman AQ ® 38D | Polyester emulsion; Eastman Chemical Company |
| Iotek ® 4080 | Ethylene acrylic acid ionomer; Exxon Chemicals, Houston, TX |
| Irgalite ® Green GLN | Phthalocyanine green pigment; Ciba-Geigy, Pigments Div., Ardsley, NY |
| Mizukasil ® SK7 | Silica particles; Mizusawa Industrial Chemicals |
| Ryuron ® QU-628 | Vinyl chloride/vinyl propionate/vinyl acetate/methyl methacrylate copolymer; Tosoh Corporation |
| SPP M-20 | Polyvinyl alcohol acetalized with N-methyl-4-(p-formyl styryl)pyridinium methosulfate; Toyo Gosei Kogyo Co., LTD. |
| Sunsperse ® Black | Aqueous pigment dispersion; Sun LHD-9303 Chemical, Dispersions Div., Amelia, OH |
| Sunsperse ® Blue BHD-6000 | Aqueous pigment dispersion; Sun Chemical, Dispersions Div. Amelia, OH |
| Sunsperse ® Blue BHD-6015 | Aqueous pigment dispersion; Sun Chemical, Dispersions Div. Amelia, OH |
| Sunsperse ® Magenta QHD-6040 | Aqueous pigment dispersion; Sun Chemical, Dispersions Div. Amelia, OH |
| Sunsperse ® Yellow YHD-9439 | Aqueous pigment dispersion; Sun Chemical, Dispersions Div. Amelia, OH |
| Tispeel XA51-824A | Melamine acrylic resin; Hitachi Kasei Polymer, Japan |
| Vylonal MD | Heat sealable polyester resin emulsions; Toyobo Co., Japan |
| Zonyl ® FSO-100 | Perfluoroalkyl surfactant; DuPont, Wilmington, DE |
| UGRA test strip | Dot range 0.5%–99.5% dots, Graphic Arts Technical Foundation, Pittsburgh, PA. |

Example 1

Photosensitive Element:

The photosensitive film element used in this example had in order, the following structure: (1) an approximately 1 micron photosensitive layer, (2) a 1 micron adhesive layer (3) an approximately 3 micron release layer (4) a 4-mil polyethylene terephthalate support. The photosensitive layer was composed of SPP M-20. The adhesive layer was composed of a 30:70 mixture of Vylonal MD-1400 and Vylonal MD-1100. The release layer was composed of Tispeel XA51-824A (4.9 parts by weight), Ryuron® QU-628 (93.2 parts by weight), Mizukasil® SK7 (1.5 parts by weight), and Dryer 900 (0.4 parts by weight).

Aqueous Permeable, Colorant-Containing Composition Applied or "Inked" Photosensitive Element:

The inked photosensitive element was prepared as described below.

Transfer Element:

The transfer element used was a commercially available WaterProof® Transfer Sheet (manufactured by E. I. du Pont de Nemours and Co., Wilmington, Del.).

Process Steps:

Step 1.

An aqueous permeable, colorant-containing composition comprising a solution of 1 part Sunsperse® Blue BHD-6015 and 49 parts water was applied or "inked" onto the photosensitive layer by coating using a wire-wound rod.

Step 2.

The inked photosensitive element was placed in a vacuum frame with the ink layer up, i.e., facing the source of actinic radiation. A negative separation transparency for cyan was placed on top of the ink layer with the emulsion side of the transparency in contact with the ink layer and the base side up. A vacuum was drawn on the element and separation transparency for about 90 sec prior to exposure. The element was exposed for about 20 sec with the radiation from a 5 kW high pressure mercury vapor lamp, (Olec L1261 lamp, Olec Olix AL985 Integrator and Olite AL53-100 power supply, Olec, Inc., Irvine, Calif.) about 137 cm above the element and separation transparency. After exposure, the separation transparency was removed from the exposed photosensitive element.

Step 3.

The element was then developed and dried using a WaterProof® WashOff Unit (DuPont) which utilized a 24° C. water stream and rotating brush to remove the non-exposed areas of the photosensitive and ink layers. The element was then dried at a dryer temperature of approximately 110° C.

Step 4.

The coversheet of the transfer element was removed by peeling. The image-carrying element was placed on the revealed layer of the transfer element with the image down and then laminated using a WaterProof® Laminator (DuPont) at 100° C., 150 lbs, 400 mm/min.

The photosensitive element support and release layer were next removed by peeling, and thus, effectively transferring the cyan image to the transfer element. The result was a wrong-reading cyan image on the transfer element.

Step 5.

The cyan image on the transfer element was placed image down on a piece of LOE paper stock and then laminated at 100° C., 450 lbs, and 400 mm/min. The transfer element was then removed by peeling to reveal a stain-free cyan proof on LOE paper. The proof image results are shown in Table 1.

TABLE 1

| Color | Color Density | UGRA % Dots | UGRA Resolution (μ) | UGRA 50% Dot |
|---|---|---|---|---|
| Gain Cyan | 1.39 | 0.5–99.5 | 6 | 15 |

Example 2

Example 1 was repeated with the following differences: the aqueous permeable, colorant-containing composition used was a solution of 3.8 parts Aurora Pink® EPX-11, 11.4 parts Eastman AQ® 38D, and 34.8 parts water. The aqueous permeable, colorant-containing composition applied or "inked" element was exposed through a negative separation transparency for magenta for 10 seconds. A pink image was formed instead of a cyan image. The proof image results are shown in Table 2.

TABLE 2

| Color | Magenta Color Density | UGRA % Dots | UGRA Resolution (μ) |
|---|---|---|---|
| Pink | 0.44 | 2–98 | 8 |

Example 3

Film Elements.

The photosensitive and transfer elements were prepared according to the procedure in Example 1.

Process Steps:

Step 1.

The photosensitive element was "inked" using a Hewlett Packard Desk Jet 550C ink jet printer. Three approximately 1"×7" single-color, solid ink strips of cyan, magenta and yellow inks were applied to the photosensitive layer using the ink jet printer.

The inks used had the following compositions and were prepared using a procedure similar to that described in Example 1 of U.S. Pat. No. 5,310,778 issued May 10, 1994:

| INGREDIENT | AMOUNT (%) |
|---|---|
| Cyan Ink: | |
| Monolite ® Green 751 pigment, Zeneca, Inc., Wilmington, DE. | 0.83 |
| Endurophthal ® Blue GF, Cookson Pigments, Inc., Newark, NJ. | 1.67 |
| Butyl methacrylate/methyl methacrylate/ methacrylic acid, (BMA/MMA//MAA) (10/5//10)[1] | 1.67 |

| INGREDIENT | AMOUNT (%) |
|---|---|
| Diethylene glycol | 5.70 |
| Liponics ® EG-1, Lipo Chemical Co., Paterson, NJ. | 5.70 |
| N-methyl pyrrolidinone | 0.90 |
| Deionized water | 83.50 |
| The ink had a pigment to binder ratio of 2:1. | |
| Magenta Ink: | |
| Quindo ® Magenta RV6803, Miles, Inc., Pittsburg, PA. | 2.175 |
| Indofast ® Brilliant Scarlet R6300, (Pigment Red 163, C.I. No. 71145), Miles, Inc., Pittsburg, PA. | 0.325 |
| Butyl methacrylate/methyl methacrylate/ methacrylic acid, (BMA/MMA//MAA) (10/5//10)[1] | 1.67 |
| Diethylene glycol | 5.70 |
| Liponics ® EG-1, Lipo Chemical Co., Paterson, NJ. | 5.70 |
| N-methyl pyrrolidinone | 0.90 |
| Deionized water | 83.53 |
| The ink had a pigment to binder ratio of 1.5:1. | |
| Yellow Ink: | |
| Permanent Yellow GG pigment, Hoechst Celanese, Specialty Chemicals Group, Charlotte, NC. | 2.50 |
| Butyl methacrylate/methyl methacrylate// methacrylic acid, (BMA/MMA//MAA) (10/5//10)[1] | 1.67 |
| Diethylene glycol | 5.70 |
| Liponics ® EG-1, Lipo Chemical Co., Paterson, N.J. | 5.70 |
| N-methyl pyrrolidinone | 0.90 |
| Deionized water | 83.53 |
| The ink had a pigment to binder ratio of 1.5:1. | |

[1]Polymer 3 in U.S. Pat. No. 5,310,778. Made as described therein.

Step 2.

The inked photosensitive element was exposed for 50 sec, developed, and then transferred to the transfer element as described in Steps 2–4 of Example 1. The result was a set of wrong-reading cyan, magenta, and yellow images on the transfer element.

Step 3.

The images on the transfer element were transferred to LOE paper stock as described in Step 5 of Example 1. The result was a set of 3 single-color images on LOE. Proof image results are shown in Table 3.

TABLE 3

| Color | Color Density | UGRA % Dots | UGRA Resolution (μ) |
|---|---|---|---|
| Cyan | 0.8 | 2–98 | 8 |
| Magenta | 0.6 | 2–99 | 6 |
| Yellow | 0.5 | 5–97 | 20 |

Example 4

Film Elements:

The photosensitive and transfer elements were prepared according to the procedure described in Example 1.

Process Steps:

Step 1.

Four separate photosensitive elements were "inked" by individually coating the following solutions onto separate photosensitive layers using a wire-wound rod.

The aqueous permeable, yellow pigment-containing solution was comprised of 1 g Sunsperse® Yellow YHD-9439, 49 g water and 0.03 g Zonyl® FSO-100.

The aqueous permeable, magenta pigment-containing solution was comprised of 1 g Sunsperse® Magenta QHD-6040, 49 g water and 0.03 g Zonyl® FSO-100.

The aqueous permeable, cyan pigment-containing solution was comprised of 1 g Sunsperse® Blue BHD-6000, 49 g water and 0.03 g Zonyl® FSO-100.

The aqueous permeable, black pigment-containing solution was comprised of 1 g Sunsperse® Black LHD-9303, 49 g water and 0.03 g Zonyl® FSO-100.

Step 2.

The "inked" photosensitive elements were exposed for 14 (magenta), 20 (yellow), and 40 (cyan, black) sec through the corresponding negative separation transparencies and then developed using a WaterProof® WashOff Unit as described in Steps 2 and 3 of Example 1.

Step 3.

The black image was then transferred to the transfer element as described in Step 4 of Example 1. The result was a wrong-reading black image on the transfer element.

Step 4.

The cyan image was next registered over the wrong-reading black image on the transfer element followed by transfer lamination of the cyan image as described in Step 4 of Example 1. The result was a wrong-reading 2-color image on the transfer element.

Step 5.

Step 4 was then repeated sequentially with each of the developed magenta and yellow images to obtain a wrong-reading 4-color image on the transfer element.

Step 6.

The wrong-reading 4-color image on the transfer element was then transferred to LOE paper stock as described in Step 5 of Example 1. The result was a right-reading 4-color proof on LOE paper stock.

Example 5

Film Elements:

The first photosensitive element had the following structure: (1) an approximately 1 micron photosensitive layer, (2) a 1 micron adhesive layer, (3) an approximately 50 micron cushion layer with a release surface and (4) a 7-mil polyethylene terephthalate support. The photosensitive and adhesive layers were the same as those described in Example 1. The cushion layer was composed of Iotek® 4080 (about 98% by wt) and Irgalite® Green GLN (about 2% by wt). The transfer element was the same as that described in Example 1.

Process Steps:

Step 1.

The first photosensitive element was "inked" by coating a solution of 1 g Sunsperse® Blue BHD-6000, 49 g water and 0.03 g Zonyl® FSO-100 onto the photosensitive layer using a wire-wound rod.

Step 2.

The inked first photosensitive element was exposed for 40 sec through a negative separation transparency for cyan and then developed using a WaterProof® WashOff Unit as described in Steps 2 and 3 of Example 1.

Step 3.

A second photosensitive element comprised of of adhesive and photosensitive layers was then laminated, with the adhesive layer adjacent the developed image on the first photosensitive element.

Step 4.

The second photosensitive layer was "inked" using the aqueous permeable, yellow pigment-containing solution of Example 4.

Step 5.

The inked second photosensitive layer was next exposed for 40 sec through a negative separation transparency for yellow in register over the cyan image and developed as described in Steps 2 and 3 of Example 1. The result was a right-reading 2-color image on the carrier element.

Step 6.

The right-reading 2-color image was then transferred to the transfer element using the same conditions as described in Step 5 of Example 1. The result was a wrong-reading 2-color image on the transfer element.

Step 7.

The wrong-reading 2-color image on the transfer element was then transferred to LOE paper stock as described in Step 5 of Example 1. The result was a right-reading 2-color proof on LOE paper stock.

Example 6

Film Elements:

Two photosensitive elements prepared according to the procedure described in Example 1 were used. The transfer element was Fuji Color-Art Receiver Film CR-T3.

Process Steps:

Step 1.

Two separate photosensitive elements were "inked" by individually coating the following solutions onto separate photosensitive layers using a wire-wound rod.

The aqueous permeable, magenta pigment-containing solution was comprised of 2 g Sunsperse® Magenta QHD-6040, 48 g water and 0.03 g Zonyl® FSO-100.

The aqueous permeable, cyan pigment-containing solution was comprised of 1 g Sunsperse® Blue BHD-6000, 49 g water and 0.03 g Zonyl® FSO-100.

Step 2.

The "inked" photosensitive elements were each exposed for 40 sec through the corresponding negative separation transparencies and then developed using a WaterProof® WashOff Unit as described in Steps 2 and 3 of Example 1.

Step 3.

The cyan image was then transferred to the transfer element as described in Step 4 of Example 1. The result was a wrong-reading cyan image on the transfer element.

Step 4.

The magenta image was next registered over the wrong-reading cyan image on the transfer element followed by transfer lamination of the magenta image as described in Step 4 of Example 1. The result was a wrong-reading 2-color image on the transfer element.

Step 5.

The wrong-reading 2-color image on the transfer element was then transferred to LOE paper stock as described in Step 5 of Example 1. At least one layer of the transfer element also transferred with the 2-color image, yielding a right-reading 2-color proof with high gloss on LOE paper stock.

Having described the invention, we now claim the following and their equivalents.

What is claimed is:

1. A process for forming a colored image comprising, in order:

(A) applying at least one aqueous-permeable, colorant-containing composition to a photosensitive element comprising, in order, (1) a carrier element having a release surface, said carrier element being resistant to aqueous liquid development, (2) a first adhesive layer, (3) an unpigmented, first photosensitive layer consisting essentially of a photosensitive composition which is developable by aqueous liquid which is selected from water or an aqueous solution that consists essentially of water, wherein the aqueous-permeable, colorant-containing composition is applied to said first photosensitive layer;

(B) imagewise exposing to actinic radiation the photosensitive element from step (A) having applied thereon the permeable, colorant-containing composition to form imagewise exposed and unexposed regions in the unpigmented, first photosensitive layer and the overlying permeable, colorant-containing composition;

(C) developing the exposed element from step (B) by washing with an aqueous liquid, thereby removing either the imagewise exposed or imagewise unexposed regions of the unpigmented first photosensitive layer and its overlying aqueous-permeable, colorant-containing layer, to produce a first colored pattern;

(D) laminating to the element from step (C) a transfer element having a release surface, wherein the release surface is adjacent to the first colored pattern in the element from step (C);

(E) removing said carrier element having a release surface, revealing the adhesive layer;

(F) laminating the element from step (E) to a permanent support, wherein the adhesive layer is adjacent to the permanent support; and (G) removing said transfer support having a release surface; wherein the adhesion force between the release surface of said carrier element and said adhesive layer has a value of F1; the adhesion force between said adhesive layer and said first colored pattern has a value of F2; the adhesion force between said first colored pattern and said release surface of said transfer support has a value of F3; and the adhesion force between said adhesive layer and said permanent support has a value of F4; and wherein
each of F2 and F3 is greater than F1, and
each of F2 and F4 is greater than F3.

2. The process of claim 1 additionally comprising, in order following step (C):

(C1) laminating to the element from step (C) an unpigmented element, said unpigmented element comprising,
  (1) an additional support,
  (2) an underlying additional photosensitive layer comprising,
    (a) an aqueous liquid developable, unpigmented, photosensitive composition, and
  (3) an underlying additional adhesive layer; wherein the additional adhesive layer is adjacent to and overlying the first colored pattern in the element from step (C);

(C2) removing said additional support;

(C3) applying at least one aqueous permeable colorant-containing composition to the additional photosensitve layer;

(C4) imagewise exposing to actinic radiation said additional photosensitive layer and the aqueous permeable colorant-containing composition in register with the previously formed first colored pattern to form imagewise exposed and imagewise unexposed regions;

(C5) developing said exposed additional photosensitive layer and the aqueous permeable colorant-containing composition from step (C4) by washing with an aqueous liquid, thereby removing either the imagewise exposed or imagewise unexposed regions, to produce an additional colored pattern; and optionally;

(C6) repeating, in order, steps (C1) to (C5) one or more times; wherein the adhesion force between any of the additional photosensitive layers prior to exposure to actinic radiation and its overlying additional support has a value less than each of F1 and F2 and is less than each of the adhesion forces between adhesive layers and adjacent photosensitive layers or colored patterns; wherein the adhesion force between said additional adhesive layer and said underlying first colored pattern has the value F5, the adhesion force between any of said additional adhesive layers and the underlying additional colored pattern has the value F5i, the adhesion force between any of said additional adhesive layers and the overlying additional colored pattern has the value F2i, the adhesion force between the uppermost additional colored pattern and said release surface of said transfer support has a value F3n, and the adhesion force between the additional adhesive layer and the overlying additional photosensitive layer prior to exposure to actinic light has the value F6, and wherein
each of F2, F3, F2i, F3n, F5, F5i and F6 is greater than F1, and
each of F2, F2i, F4, F5, F5i is greater than F3n.

3. The process of claim 1 wherein after step (E), steps (A) through (E) are repeated at least once using at least one different aqueous permeable, colorant-containing composition, a different photosensitive element, and the element from step (E) as the transfer element in step (D).

4. The process of claim 1, 2 or 3 wherein the release surface on the carrier element comprises a release layer.

5. The process of claim 1, 2 or 3 wherein the release surface on the carrier element comprises a cushion layer.

6. The process of claim 5 wherein the photosensitive element further comprises at least one carrier anchor layer between the carrier cushion layer and the carrier element, wherein the adhesion force between the carrier element and the carrier anchor layer, and the adhesion force between the carrier anchor layer and the carrier cushion layer are individually greater than F1.

7. The process of claim 1, 2 or 3 wherein the release surface on the transfer element comprises at least one release layer.

8. The process of claim 7 wherein the release surface on the transfer element comprises first and second release layers, the first release layer being adjacent to the first colored pattern, and wherein the adhesion force between the first colored pattern and the first release layer is greater than the adhesion force between the first and second release layers.

9. The process of claim 1, 2 or 3 wherein the release surface on the transfer element comprises at least one cushion layer.

10. The process of claim 9 wherein the release surface on the transfer element comprises first and second cushion layers, the first cushion layer being adjacent to the first colored pattern, and wherein the adhesion force between the first colored pattern and the first cushion layer is greater than the adhesion force between the first and second cushion layers.

11. The process of claim 9 wherein the photosensitive element further comprises at least one transfer anchor layer between the transfer cushion layer and the transfer support, wherein the adhesion force between the transfer support and the transfer anchor layer, and the adhesion force between the transfer anchor layer and the transfer cushion layer are individually greater than F1, F3 and F3n.

12. The process of claim 5 wherein the carrier cushion layer comprises a compound selected from the group consisting of ethylene/vinyl acetate copolymers, ethylene homopolymers, propylene homopolmers, ethylene/propylene copolymers, ethylene/methacrylate copolymers, ethylene/methacrylic acid/isobutylacrylic acid ionomers, ethylene/methacrylic acid copolymers, ethylene/methacrylic acid ionomers, ethylene/acrylic acid copolymers, ethylene/acrylic acid ionomers, and mixtures thereof.

13. The process of claim 9 wherein the at least one transfer cushion layer comprises a compound selected from the group consisting of ethylene/vinyl acetate copolymers, ethylene/methacrylate copolymers, ethylene/methacrylic acid/isobutylacrylic acid ionomers, ethylene/methacrylic acid copolymers, ethylene/methacrylic acid ionomers, ethylene/acrylic acid copolymers, ethylene/acrylic acid ionomers, and mixtures thereof.

14. The process of claim 1, 2 or 3 wherein the carrier cushion layer comprises a compound selected from the group consisting of ethylene/methacrylic acid copolymers, ethylene/methacrylic acid ionomers, ethylene/acrylic acid copolymers, ethylene/acrylic acid ionomers, and mixtures thereof and the transfer cushion layer comprises an ethylene/vinyl acetate copolymer.

15. The process of claim 1, 2 or 3 wherein the photosensitive composition comprises a material selected from the group consisting of N-alkyl styrylpyridinium derivatives of polyvinyl alcohol, N-alkyl styrylquinolinium derivatives of polyvinyl alcohol, and mixtures thereof.

16. The process of claim 1, 2 or 3 wherein the adhesive layer comprises a material selected from the group consisting of vinyl chloride/vinylacetate copolymers, ethylene/vinylacetate copolymers, polyesters, and mixtures thereof.

17. The process of claim 1, 2 or 3 wherein the aqueous liquid is water.

18. The process of claim 1, 2 or 3 wherein the aqueous permeable, colorant-containing composition is applied as a layer.

19. The process of claim 1, 2 or 3 wherein the aqueous permeable colorant-containing composition is absorbed into the unpigmented first photosensitive layer.

20. The process of claim 1, 2 or 3 wherein the aqueous permeable colorant-containing composition is printed on the unpigmented, first photosensitive layer using an ink jet printer.

21. The process of claim 20 wherein the aqueous permeable colorant-containing composition is an ink comprising an aqueous carrier medium and a colorant.

22. The process of claim 21 wherein the colorant is a pigment dispersion.

23. The process of claim 21 wherein the colorant is a dye.

24. The process of claim 18 wherein the surface of the layer of the aqueous permeable colorant-containing composition away from the unpigmented photosensitive layer is matte-finished.

25. The process of 19 wherein the surface of the unpigmented photosensitive layer having the aqueous permeable colorant-containing composition absorbed therein is matte-finished.

26. The process of claim 1, 2 or 3 wherein the unpigmented photosensitive layer is matte-finished prior to application of the aqueous permeable colorant-containing composition.

* * * * *

UNITED STATES PATENT AND TRADEMARK OFFICE
Certificate

Patent No. 5,534,387                                                                   Patented: July 9, 1996

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Gregory A. Bodager, Monroeton, Pa.; Philip L. Beighle, Colts Neck, N.J.; and Daphne Pintor Fickes, Kennett Square, Pa.

Signed and Sealed this First Day of February, 2000.

MARIA NUZZOLILLO
                                                                                                 *SPE* Art Unit 1745